(12) United States Patent
Kasai

(10) Patent No.: US 6,465,826 B2
(45) Date of Patent: *Oct. 15, 2002

(54) EMBEDDED LSI HAVING A FERAM SECTION AND A LOGIC CIRCUIT SECTION

(75) Inventor: Naoki Kasai, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/752,950

(22) Filed: Jan. 2, 2001

(65) Prior Publication Data

US 2001/0020708 A1 Sep. 13, 2001

Related U.S. Application Data

(63) Continuation of application No. 09/606,452, filed on Jun. 29, 2000, now Pat. No. 6,218,197.

(30) Foreign Application Priority Data

Jul. 2, 1999 (JP) ............................................ 11-189025

(51) Int. Cl.⁷ .......................... H01L 29/76; H01L 27/108
(52) U.S. Cl. ....................... 257/295; 257/296; 257/303; 257/306; 257/310; 438/253

(58) Field of Search ................................. 257/295, 296, 257/310, 303, 306; 438/3, 253, 250, 251, 252, 254, 255, 240, 241, 381, 390–399

(56) References Cited

U.S. PATENT DOCUMENTS

| | | | | |
|---|---|---|---|---|
| 6,121,648 A | * | 9/2000 | Evans, Jr. | 257/295 |
| 6,218,197 B1 | * | 4/2001 | Kasai | 438/3 |
| 6,285,050 B1 | * | 9/2001 | Emma et al. | 257/296 |

* cited by examiner

*Primary Examiner*—Steven Loke
*Assistant Examiner*—Donghee Kang
(74) *Attorney, Agent, or Firm*—Hutchins, Wheeler & Dittmar

(57) ABSTRACT

An embedded LSI includes a FeRAM macro block and an associated logic circuit section. A hydrogen barrier layer covers the FeRAM macro block as a whole and exposes the logic circuit section. The edge of the hydrogen barrier layer overlies the peripheral circuit of the FeRAM macro block and the boundary separating the FeRAM macro block from the logic circuit section. The ferroelectric capacitor is protected by the hydrogen barrier layer against hydrogen during a hydrogen-annealing process.

10 Claims, 12 Drawing Sheets

EMBEDDED LSI HAVING A FERAM SECTION AND A LOGIC CIRCUIT SECTION

This application is a continuation of U.S. patent application Ser. No. 09/606,452 filed on Jun. 29, 2000, now U.S. Pat. No. 6,218,197.

BACKGROUND OF THE INVENTION (a) Field of the Invention

The present invention relates to an embedded LSI and, more particularly, to an embedded LSI having a FeRAM section and a logic circuit section.

(b) Description of the Related Art

Recently, IC cards each having a nonvolatile memory device and a logic circuit embedded on a single substrate are expected to replace conventional magnetic cards. The nonvolatile memory device in the IC card generally includes a memory cell array and an associated peripheral circuit including a drive section and a decoder section, whereas the logic circuit includes a processing section for conducting data processing and an input/output section for conducting input/output processing in association with the peripheral circuit and the memory cell array.

With the increase in the amount of data to be stored in the memory cell array, a conventional EEPROM used as the nonvolatile memory device will be rapidly replaced by a FeRAM which has a larger storage capacity with high speed operation and low power disspation. The FeRAM has in each memory cell a ferroelectric capacitor having a ferroelectric film as a capacitor insulator film.

In fabrication of MOSFETs which constitute the logic circuit section in the embedded LSI, a hydrogen-annealing step is conducted to the wafer for several tens of minutes at a temperature of about 400 to 450° C. in a hydrogen ambient containing several percents to fifty percents hydrogen. The hydrogen annealing step is conducted for the purpose of finally adjusting the transistor characteristics such as the interface state of the gate oxide, fixed electric charge, ON-current and threshold voltage of the MOSFETs. The hydrogen-annealing step is generally conducted after fabrication of the metallic interconnect structure and before formation of the passivation film.

In the FeRAM section in the embedded LSI, it is known that the ferroelectric capacitor having a ferroelectric film including a perovskite metal oxide such as PZT or BST is liable to desorption of oxygen from the ferroelectric film in a reducing ambient of the hydrogen-annealing. The desorption of oxygen damages the ferroelectric film of the ferroelectric capacitor and thus degrades characteristics of the ferroelectric capacitor, which is undesirable.

It is known that the desorption of oxygen is also incurred by a CVD process for depositing a metallic film in the interconnect structure or a plasma-enhanced CVD process for depositing a silicon oxide film as an interlayer dielectric film. This is because these CVD steps also generate hydrogen similarly to the hydrogen-annealing step, and therefore provides similar adverse effects to the ferroelectric film.

FIG. 1 shows a typical configuration of an embedded LSI having a logic circuit section 16 and a FeRAM section 11 disposed as a FeRAM macro block, and FIG. 2 is a schematic sectional view of the LSI of FIG. 1. The FeRAM section 11 includes a FeRAM cell array 12 and a peripheral circuit 14 disposed in the periphery of the FeRAM section 11. The FeRAM cell array 12 is covered by a hydrogen barrier layer 18, which protects the FeRAM cell array 12 against the hydrogen generated during the hydrogen-annealing step conducted to the logic circuit section 16 and the peripheral circuit 14 of the FeRAM section 11. The term "hydrogen barrier layer" as used herein means a film that prevents hydrogen from penetrating therethrough, such as a film made of a hydrogen-containing alloy or a metallic film having a barrier property against hydrogen.

The FeRAM cell array 12, the peripheral circuit 14 and the logic circuit section 16 are separated from one another by isolation films 19 constituting boundary areas, as shown in FIG. 2. Each FeRAM cell includes a MOSFET 36 having a pair of source/drain regions 22 and a gate electrode 20, and a ferroelectric capacitor 32 having a top electrode 26, a capacitor insulator film 28 and a bottom electrode 30. One of the source/drain regions 22 is connected to the top electrode 26 via a contact plug 33 and a first level interconnect 34.

The logic circuit section 16 includes a MOSFET 38, whereas the peripheral circuit 14 includes a MOSFET 36 having source/drain regions, one of which is connected to the bottom electrode 30 of the capacitor 32 via a contact plug 35 and a first level interconnect 34. Above the first level interconnects 34, second level interconnects 37 extend which are connected to the first level interconnects 34 and one of source/drain regions of the MOSFET 38.

The hydrogen barrier layer 18 disposed between the first level interconnects 34 and the second level interconnects 37 covers the FeRAM cell array 12 and extends to the boundary between the FeRAM cell array 12 and the peripheral circuit 14.

In the embedded LSI as described above, the capacitor insulator film 28 in the ferroelectric capacitor 32 is damaged by the hydrogen generated in the hydrogen-annealing process conducted for the logic circuit section 16 and the peripheral circuit 14. The hydrogen obliquely enters the periphery of the FeRAM cell array 12 beyond the edge of the hydrogen barrier layer 32.

It is proposed to provide a hydrogen barrier layer covering the entire area for the chip including the logic circuit section 16, FeRAM cell array a12 nd the peripheral circuit 14. However, in this case, MOSFETs 36 and 38 in the logic circuit section 16 and the peripheral circuit are not subjected to hydrogen-annealing, resulting in degradation of the transistor characteristics. The degradation of the transistor characteristics may incur malfunction of the logic circuit section 16 or reduction of the operational margin thereof.

SUMMARY OF THE INVENTION

It is therefore an object of the present invention to provide an embedded LSI including a FeRAM section having a ferroelectric capacitor in each memory cell and a logic circuit section having MOSFETs, the ferroelectric capacitor and the MOSFETs having excellent characteristics.

The present invention provides an embedded LSI including a substrate, a FeRAM section and a logic circuit section formed on the substrate for operating in association with each other, the FeRAM section including an array of FeRAM cells each including a ferroelectric capacitor and an associated peripheral circuit, a boundary area for separating the FeRAM section from the logic circuit section, a hydrogen barrier layer for covering substantially an entire area of the FeRAM section and exposing the logic circuit section, and an interconnect structure including first level interconnects and second level interconnects for connecting the FeRAM cell array, the peripheral circuit and the logic circuit section, the hydrogen barrier layer having an edge substantially aligned with the boundary area.

In accordance with the present invention, the hydrogen barrier layer covering the entire area of the FeRAM section including the FeRAM cell array and the peripheral area can effectively protect the ferroelectric capacitor during the hydrogen-annealing step which recovers the MOSFETs in the logic circuit section from the damages incurred by formation of the metallic interconnect structure.

The above and other objects, features and advantages of the present invention will be more apparent from the following description, referring to the accompanying drawings.

PREFERRED EMBODIMENT OF THE INVENTION

Figure 1:
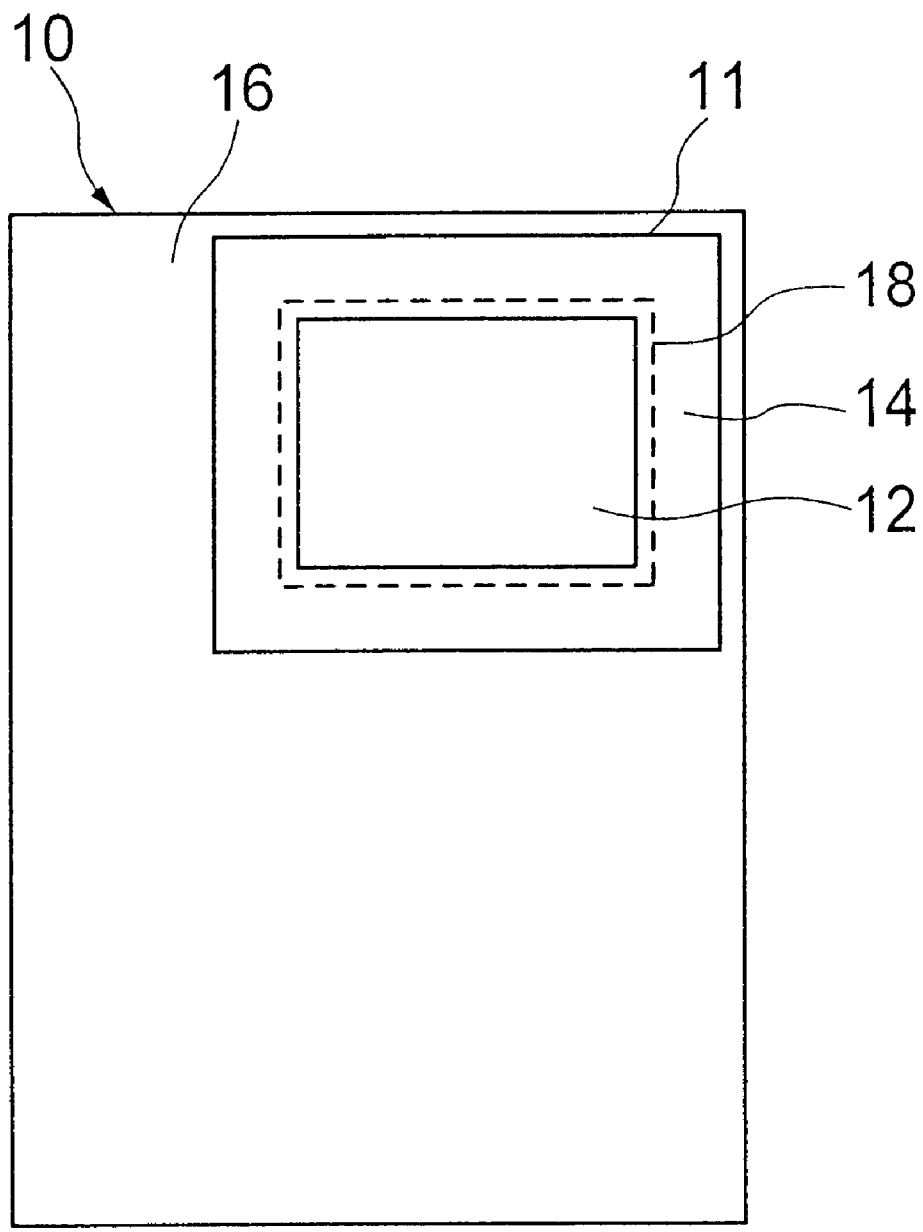
FIG. 1 is a schematic top plan view of an embedded LSI.
Figure 2:
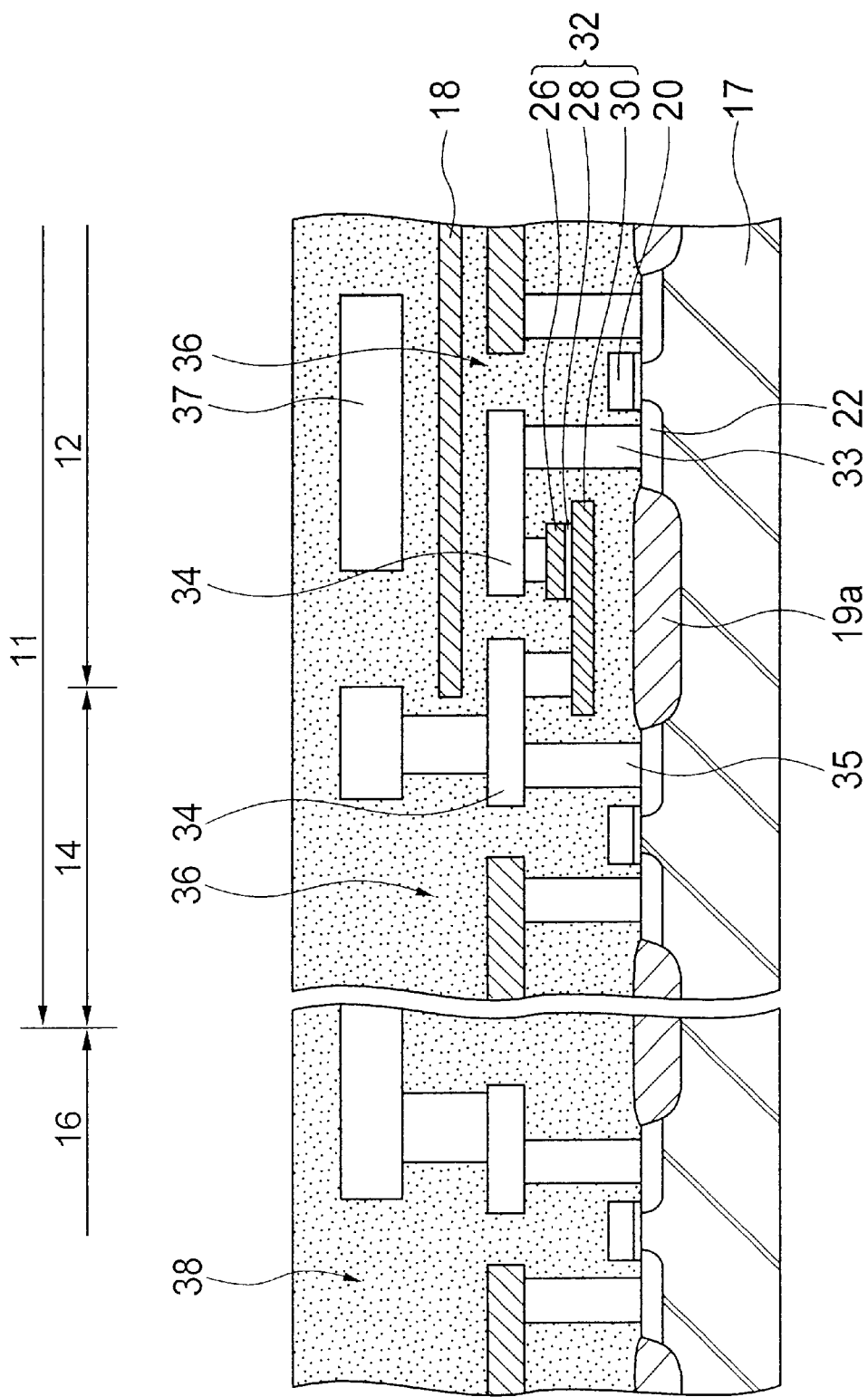
FIG. 2 is a sectional view of the embedded LSI of FIG. 1.

Now, the present invention is more specifically described with reference to accompanying drawings, wherein similar constituent elements are designated by similar reference numerals.

Figure 3:
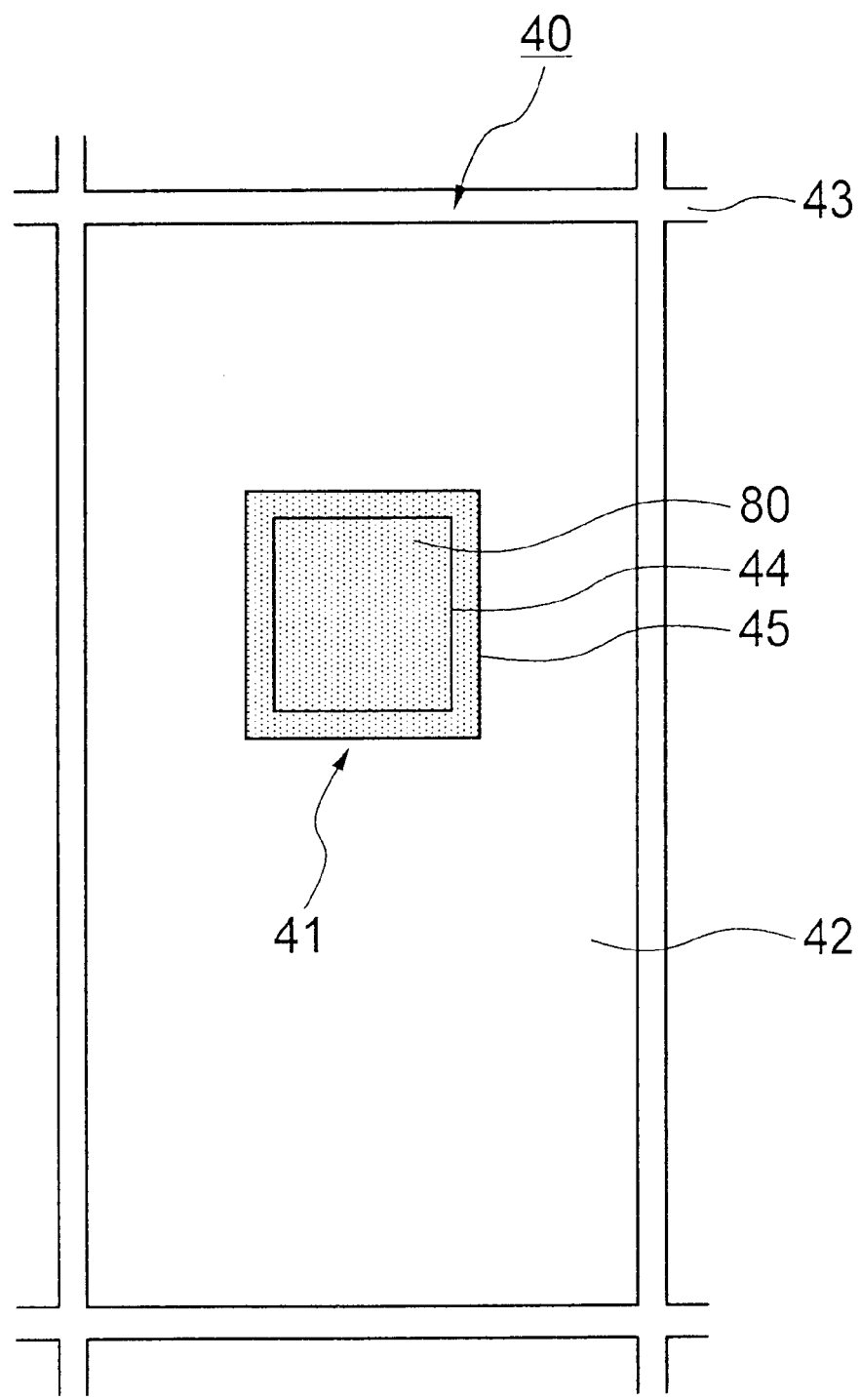
FIG. 3 is a schematic top plan view of an embedded LSI according to an embodiment of the present invention.

Referring to FIG. 3, an embedded LSI according to a first embodiment of the present invention is shown as a chip in a wafer. The LSI 40 includes a logic circuit section 42 and a FeRAM macro block 41 having a central FeRAM cell array 44 and a peripheral circuit 45 for controlling the FeRAM cell array 44. The logic circuit section 42 includes therein a microcomputer, a plurality of controllers, a SRAM, input/output interfaces and input/output pads which are not explicitly shown in the figure. The embedded LSI 40 is separated by a scribing area 43 from other embedded LSIs. The entire area for the FeRAM macro block 41 is covered by a hydrogen barrier layer 80 as shown by hatching.

Figure 4:
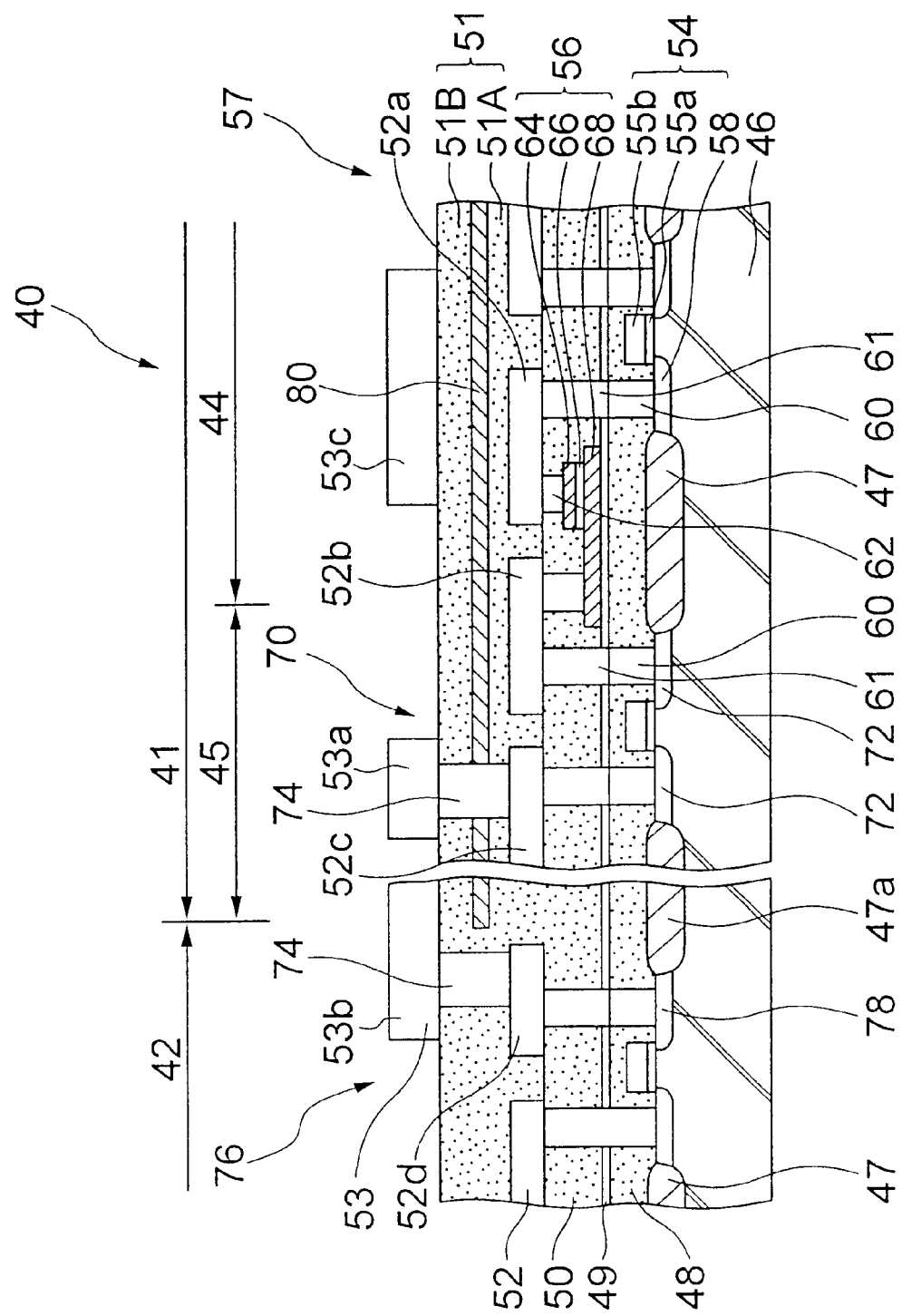
FIG. 4 is a sectional view of the embedded LSI of FIG. 3.

Referring to FIG. 4 showing a sectional view of the embedded LSI 40 of FIG. 3, the logic circuit section 42, the peripheral circuit 45 and the FeRAM cell array 44 are separated from one another by isolation films 47 (including 47a) formed on a silicon substrate 46.

The embedded LSI 40 has a laminated insulation structure including a first interlayer dielectric film 48 formed on the silicon substrate 46, and a 100-nm-thick contact plug protective film 49 made of $O_3$-TEOS $SiO_2$, a second interlayer dielectric film 50 and a third interlayer dielectric film 51, which are formed consecutively on the first interlayer dielectric film 48.

The second interlayer dielectric film 50 is made of $O_3$-TEOS $SiO_2$ or plasma TEOS $SiO_2$, whereas the third interlayer dielectric film 51 includes a pair of insulator films 51A and 51B each made of $O_3$-TEOS $SiO_2$ or plasma TEOS $SiO_2$. The hydrogen barrier layer 80 is interposed between the pair of insulator films 51A and 51B of the third interlayer dielectric film 51.

The embedded LSI 40 has a multi-layer interconnect structure including first level interconnects 52 formed on the second interlayer dielectric film 50, and second level interconnects 53 formed on the third interlayer dielectric film 51. Each of the first and second level interconnects 52 and 53 includes Ti/Al/TiN/Ti films in this order as viewed from the bottom.

The FeRAM cell array 41 has a plurality of memory cells 57 each including a MOSFET 54 and an associated ferroelectric capacitor 56. The MOSFET 54 includes a pair of source/drain regions 58, a 8-nm-thick gate oxide film 55a formed on the silicon substrate 46, and a gate electrode 55b formed thereon. The MOSFET 54 and the ferroelectric capacitor 56 are disposed below the third interlayer dielectric film 51 and thus below the hydrogen barrier layer 80.

The ferroelectric capacitor 56 has a top electrode 64 connected to one of the source/drain regions 58 via a first contact plug 60, a second contact plug 61, the first level interconnect 52a and a third contact plug 62, a ferroelectric film 66 having a ferroelectric property and a bottom electrode 68 formed on the contact plug protective film 49.

The bottom electrode 68 has a two-film structure including a 20-nm-thick bottom Ti film and a 150-nm-thick top Pt film. The ferroelectric film 66 is made of PZT having a thickness of 200 nm. The top electrode 64 has a two-film structure including a 50-nm-thick bottom Ir film and a 100-nm-thick top $IrO_2$ film. Each of the first contact plug 60 and the second contact plug 61 is made of tungsten formed on a two-film barrier layer including a 50-nm-thick TiN film and a 100-nm-thick Ti film.

The peripheral circuit 45 including a sense amplifier block and a decoder block has MOSFETs 70 in the vicinity of the FeRAM cell 57 below the second interlayer dielectric film 50. The MOSFET 70 has a pair of source/drain regions 72 one of which is connected to the bottom electrode 68 of the capacitor 56 via a first level interconnect 52b, and an associated gate electrode. The other of the source/drain regions 72 of the MOSFET 70 is connected to a first level interconnect 52c via a first contact plug 60 and a second contact plug 61, and also connected to a second level interconnect 53a via a fourth contact plug 74.

The logic circuit section 42 has a MOSFET 76 formed below the second interlayer dielectric film 50 in the vicinity of the MOSFET 70 in the peripheral circuit 45. The MOSFET 76 has a pair of source/drain regions 78 one of which is connected to a first level interconnect 52d via a first contact plug 60 and a second contact plug 61, and also connected to a second level interconnect 53b via a fourth contact plug 74.

Above the FeRAM cell 57 including the MOSFET 54 and the ferroelectric capacitor 56, a second level interconnect 53c extends on the second interlayer dielectric film 51.

The hydrogen barrier layer 80 is made of $Si_3N_4$, having a thickness of 100 nm, extends within the third interlayer dielectric film 51 and has an edge overlying the isolation film 47a, or boundary area, separating the peripheral circuit 45 from the logic circuit section 44.

More specifically, the FeRAM macro block 41 is entirely covered by the hydrogen barrier layer 80, whereas the logic circuit section 42 is entirely exposed from the hydrogen barrier layer 80.

The boundary area separating the peripheral circuit 45 and the logic circuit section 44 from each other may be an isolation film, an isolation trench or other isolation structures which can physically separate these circuit areas. In the present embodiment, the boundary area is implemented by the isolation film 47a. The hydrogen barrier layer 80 may have an edge aligned with either right or left edge or the center of the isolation film 47a, as viewed in the figure.

The hydrogen barrier layer 80 extending on the boundary area, i.e., isolation film 47a, separating the FeRAM macro block 41 and the logic circuit section 42 covers the whole area of the FeRAM macro block 41, whereby the hydrogen generated in the hydrogen-annealing process is blocked against entering the FeRAM cell array 44. The hydrogen entering the FeRAM macro block 41 through the logic circuit section 42 is consumed in the peripheral circuit 45 and thus does not enter the area for the FeRAM cell array 44. Thus, the ferroelectric film 66 of the capacitor 56 is not damaged by the hydrogen.

The MOSFETs 76 in the logic circuit section 42 are exposed to hydrogen during the hydrogen-annealing process, whereby characteristics of the MOSFETs 76 can be recovered from the damages incurred by the previous steps conducted, especially to the metallic interconnects.

The entire coverage of the FeRAM macro block 41 by the hydrogen barrier layer 80 raises the design margin or design choice of the FeRAM macro block 41 having the FeRAM cell array 44 as an intelligent property.

Figure 5A:
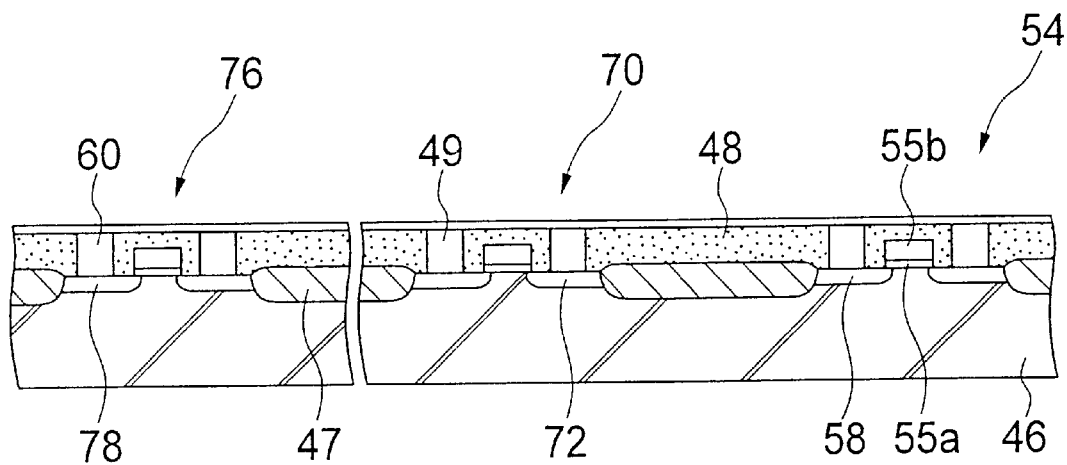
FIGS. 5A to 5F are sectional views consecutively showing fabrication steps of a process for fabricating the embedded LSI of FIGS. 3 and 4.

Referring to FIGS. 5A to 5F, a process for fabricating the embedded LSI of the present embodiment will be described. The isolation films 47 including 47a are first formed on a silicon substrate 46 as boundary areas. Subsequently, the 8-nm-thick gate oxide film 55a is formed, followed by formation of the gate electrode 55b and ion-implantation of the silicon substrate 46 to form source/drain regions 58, 72, 78, thereby forming MOSFETs 54, 70 and 76, as shown in FIG. 5A, in respective areas.

Subsequently, the first interlayer dielectric film 48 is deposited and planarized, followed by forming the through-holes therein, deposition of Ti/TiN films by sputtering, blanket CVD of a tungsten film filling the through-holes and etch-back thereof to form the first contact plug 60 in the first interlayer dielectric film 48.

A 100-nm-thick $O_3$-TEOS $SiO_2$ film is then deposited on the entire surface of the chip, thereby obtaining the contact plug protective layer 49.

Figure 5B:
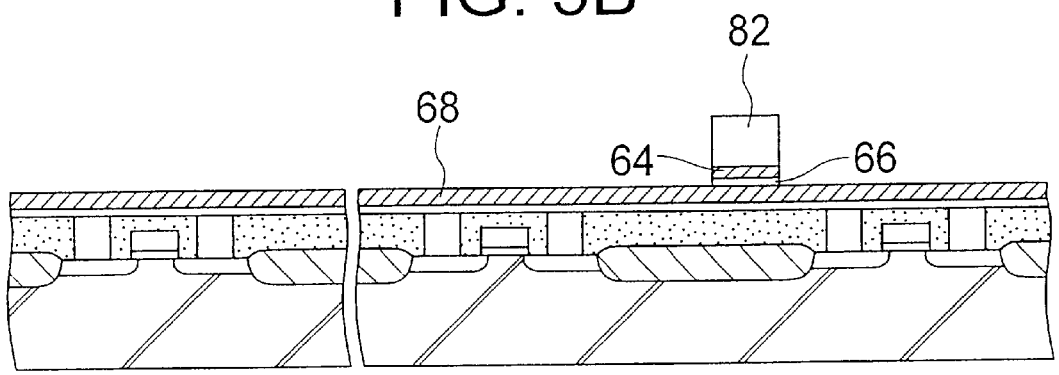

Thereafter, a 50-nm-thick Ti film and a 100-nm-thick Pt film are consecutively deposited to form a bottom electrode layer 68 having a two-film structure. Next, a 200-nm-thick PZT film is deposited by a sol-gel technique to form a ferroelectric film, and a 50-nm-thick Ir film and a 100-nm-thick $IrO_2$ film are consecutively deposited by sputtering, followed by patterning the top electrode layer 64 and the ferroelectric film 66 by using a photoresist mask 82 as an etching mask, as shown in FIG. 5B.

Figure 5C:
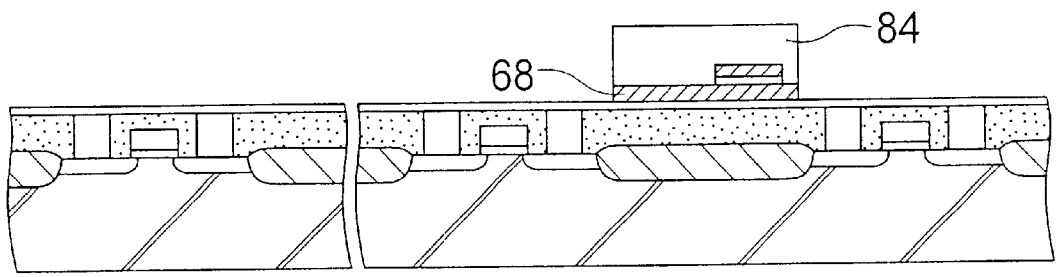

After the photoresist mask 82 is removed, the bottom electrode layer 68 is patterned using another photoresist mask 84 as an etching mask to form the bottom electrode 68, as shown in FIG. 5C.

Figure 5D:
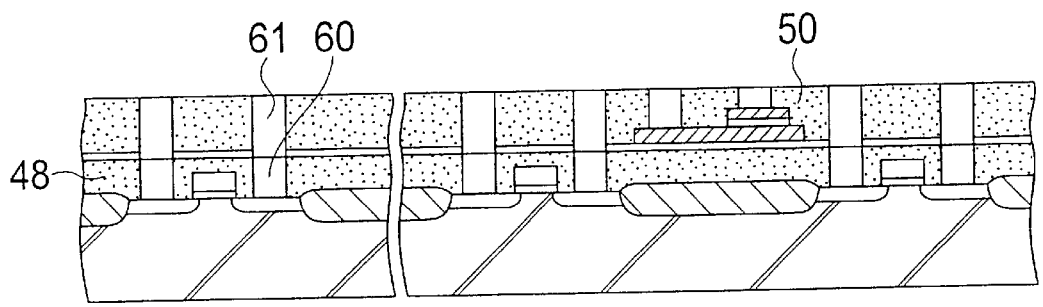
Figure 5E:
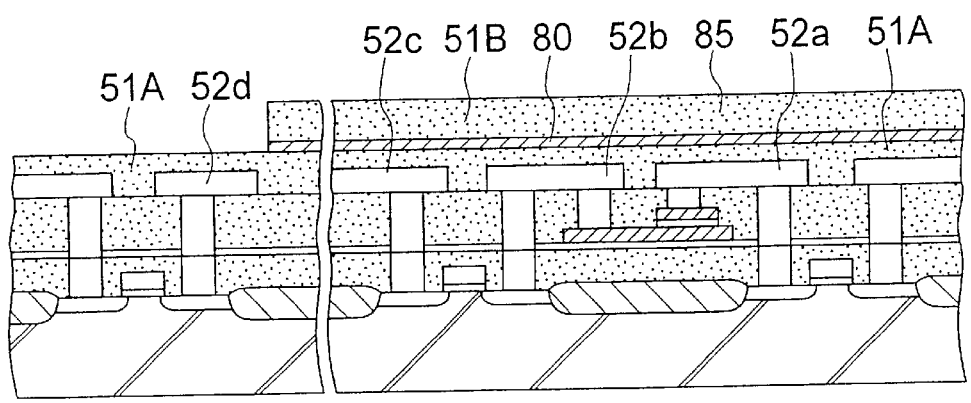

Thereafter, as shown in FIG. 5D, an $O_3$-TEOS $SiO_2$ film is deposited by a CVD technique at a temperature of 380° C. and planarized by using a CMP technique to form the second interlayer dielectric film 50.

The second interlayer dielectric film 50 is then etched to form through-holes therein, followed by deposition of Ti/TiN films by sputtering, blanket CVD of tungsten and etch-back thereof to form the tungsten plug, or second contact plug 61, filling the through-holes and extending from the top of the first contact plug 60 in the second interlayer dielectric film 50, as shown in FIG. 5D.

Thereafter, a first level interconnect layer 52 including Ti/Al/TiN/Ti films is deposited on the second interlayer dielectric film 50, followed by patterning thereof to form first level interconnects 52 including 52a, 52b, 52c and 52d.

Further, a $O_3$-TEOS $SiO_2$ or a plasma TEOS $SiO_2$ film having a thickness of 100 to 300 nm is deposited on the entire surface of the chip as the bottom third interlayer dielectric film 51A, followed by deposition of a $Si_3N_4$ film having a thickness of 100 nm by a plasma CVD technique at a temperature of 300 to 400° C. to form the hydrogen barrier layer 80. Then, the hydrogen barrier layer 80 is patterned by a RIE technique using an etching mask 85, thereby leaving the hydrogen barrier layer 80 overlying the FeRAM macro block 41.

Figure 5F:
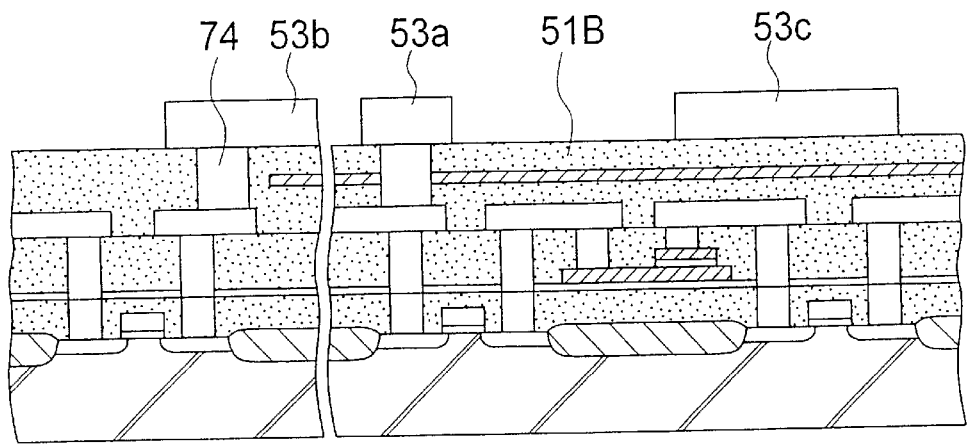

Next, another $O_3$-TEOS $SiO_2$ film or plasma TEOS $SiO_2$ film having a thickness of 100 to 300 nm is deposited on the entire surface of the chip and then planarized to form the top third layer interlayer dielectric film 51B. The top third layer interlayer dielectric film 51B is then subjected to patterning to form therein the fourth contact plug 74 having a configuration similar to those of the first and second contact plugs 60 and 61. Then, the second level interconnect layer 53 is deposited and patterned similarly to the first level interconnect layer 52 to form the second level interconnects 53 including 53a, 53b and 53c, as shown in FIG. 5F. In this configuration, contact plug penetrating the hydrogen barrier layer 80 is disposed outside the area for the FeRAM cell array.

In the embedded LSI of the present embodiment, as shown in FIG. 4, the ferroelectric capacitor 56 is disposed between the first level interconnects 52 and the second level interconnect 53. Since there is no contact plug penetrating the hydrogen barrier layer 80 in the area for the FeRAM cell array 44, the hydrogen generated during the hydrogen-annealing step does not enter the area for the FeRAM cell array 44 through the contact plug.

Figure 6:
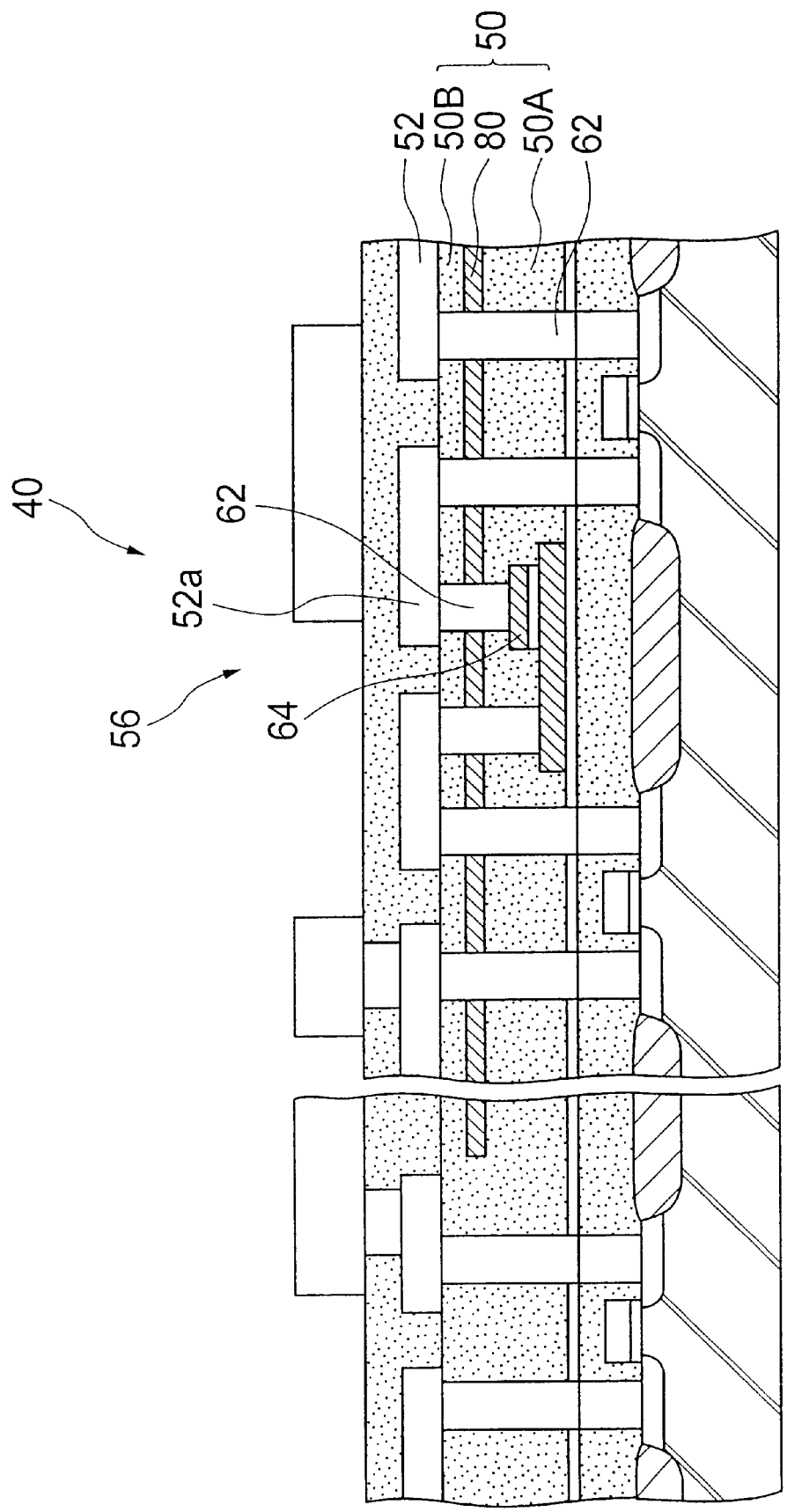
FIG. 6 is a sectional view of a modification of the embedded LSI of FIGS. 3 and 4.

Referring to FIG. 6, an embedded LSI 40 modified from the first embodiment is different from the first embodiment in that the ferroelectric capacitor 50 is disposed below the first level interconnects 52. The second interlayer dielectric film 50 includes a bottom second interlayer dielectric film 50A and a top second interlayer dielectric film 50B sandwiching therebetween the hydrogen barrier layer 80. The third contact plug 62 for connecting the first level interconnect 52a and the top electrode 56 of the ferroelectric capacitor 56 is implemented by a hydrogen-containing alloy.

The contact plugs 62 made of the hydrogen-containing alloy and penetrating the hydrogen barrier layer 80 does not allow the hydrogen generated in the hydrogen-annealing process to enter the area for the FeRAM cell array.

Figure 7:
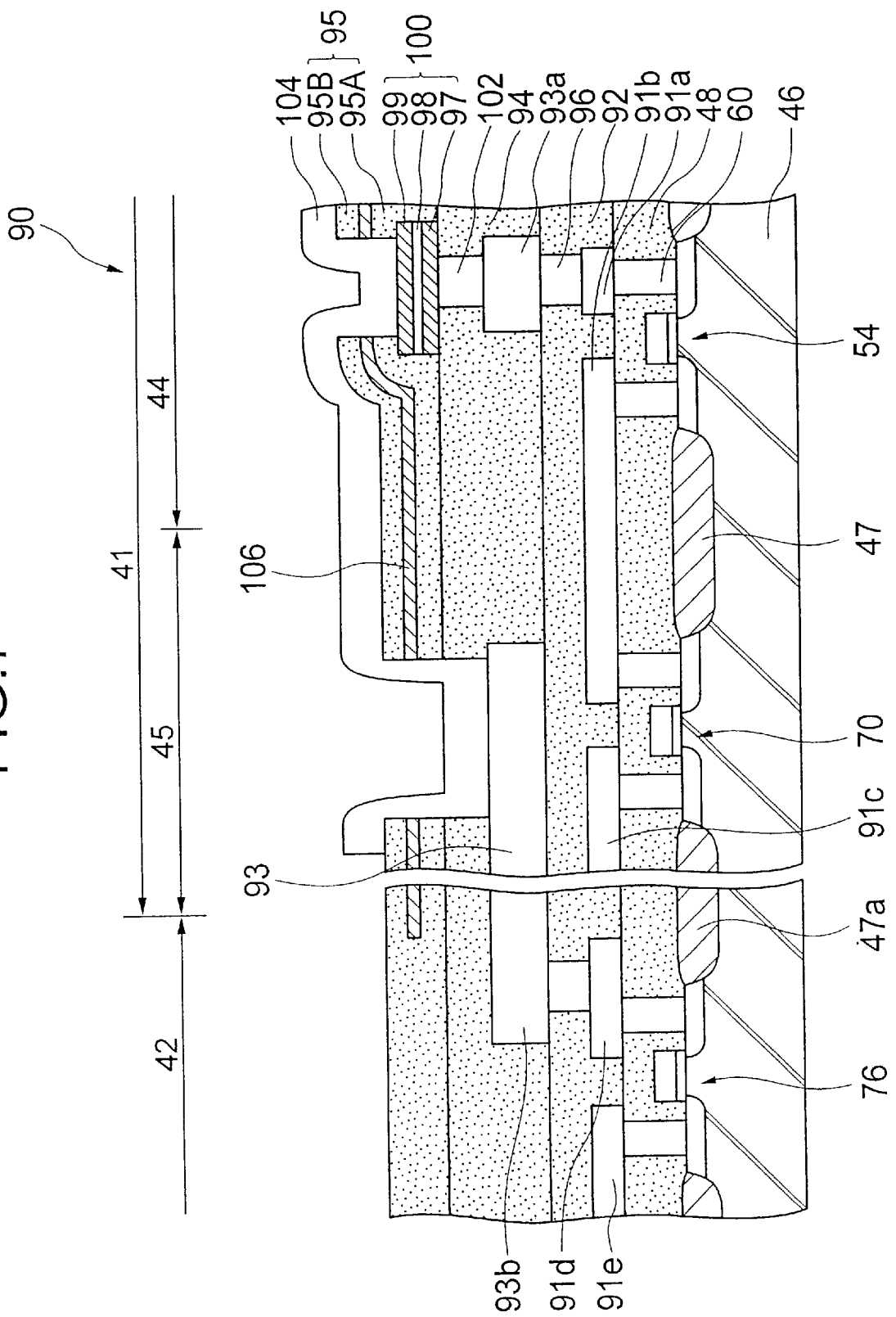
FIG. 7 is a sectional view of an embedded LSI according to a second embodiment of the present invention.

Referring to FIG. 7, an embedded LSI 90 according to a second embodiment of the present invention has configurations similar to those of the first embodiment for the first interlayer dielectric film 48 and the underlying elements, and different from the first embodiment of the present invention in that the ferroelectric capacitor 100 is disposed above the second level interconnect 93 and below the third level interconnects 104. The third level interconnects 104 are disposed only for the FeRAM cell array and are not disposed for the peripheral circuit and the logic circuit section 42.

More specifically, the embedded LSI 90 of FIG. 7 includes MOSFET 54, MOSFET 70 and MOSFET 76 in the respective circuit sections separated by the isolation films 47. The embedded LSI 90 has first level interconnects 91 including 91a to 91e, a second interlayer dielectric film 92, second level interconnects 93 including 93a and 93b, a third interlayer dielectric film 94, a fourth interlayer dielectric film 95, and a plate interconnects 104, which are consecutively formed on the first interlayer dielectric film 48. The plate interconnects 104 are disposed in the area for the FeRAM cell array. The plate interconnects 104 penetrating the fourth interlayer dielectric film 95 has a two-layer structure including an Al film and a TiN film, the latter having a hydrogen barrier property during the hydrogen-annealing step.

The first level interconnects 91a to 91e are connected to respective source/drain regions of the MOSFETs 54, 70 and 76 via the first contact plugs 60 penetrating the first interlayer dielectric film 48. The second level interconnects 93a and 93b are connected to first level interconnects 91a and 91d, respectively, through the second contact plugs 96 penetrating through the second interlayer dielectric film 92.

The ferroelectric capacitor 100 including a bottom electrode 97, a ferroelectric film 98 and a top electrode 99 similarly to the first embodiment is formed on the third interlayer dielectric film 94, with the bottom electrode 97 being connected to the second level interconnect 93a via the third contact plug 102. The fourth interlayer dielectric film 95 overlies the third interlayer dielectric film 94 and the ferroelectric capacitor 100.

The top electrode 99 is connected to the plate interconnect 104 via the through-hole formed in the fourth interlayer dielectric film 95 and to the second level interconnect 93b via the plate interconnect 104.

The fourth interlayer dielectric film 95 includes a bottom fourth interlayer dielectric film 95B and a top fourth interlayer dielectric film 95A sandwiching therebetween the hydrogen barrier layer 106, which extends over the boundary area or isolation film 47a separating the FeRAM macro block 41 and the logic circuit section 42. The hydrogen barrier layer 106 is a 100-nm-thick $Si_3N_4$ film formed by a plasma-enhanced CVD technique.

In the embedded LSI 90 of the present embodiment, the hydrogen barrier layer 106 extending over the boundary region 47a effectively protects the FeRAM macro block 41 against the hydrogen generated in the hydrogen-annealing process for the logic circuit section 42. The first level interconnect 91b connecting the FeRAM cell and the peripheral circuit is covered by the hydrogen barrier layer 80 without penetrating therethrough.

Figure 8A:
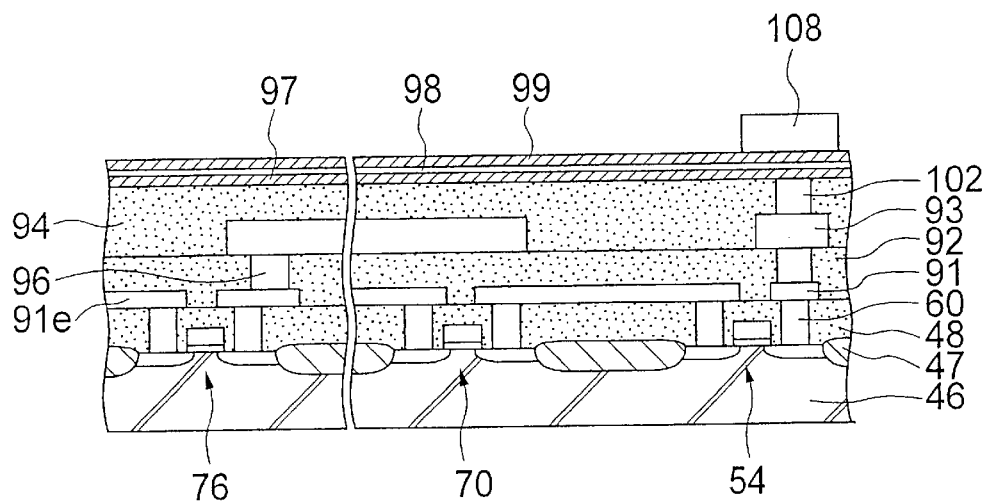
FIGS. 8A to 8C are sectional views consecutively showing the steps of a process for fabricating the embedded LSI of FIG. 7.
Figure 8B:
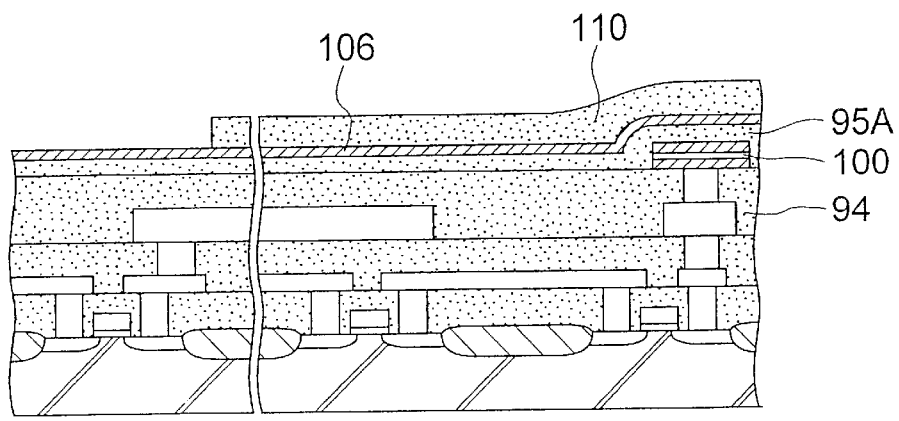
Figure 8C:
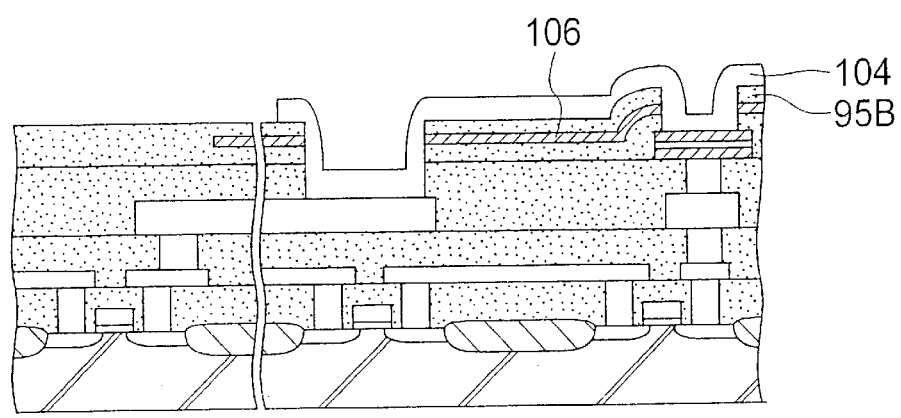

Referring to FIGS. 8A to 8C, a process for fabrication of the embedded LSI 90 of FIG. 7 will be described. First, isolation films 47 are formed on a silicon substrate 46, followed by formation of the MOSFETs 54, 70 and 76 in the respective area. Then, the first interlayer dielectric film 48 is deposited and planarized, followed by patterning thereof to form through-holes therein. Thereafter, Ti/TiN films are deposited by sputtering and a tungsten film is deposited thereon by a blanket CVD technique and subjected to etch-back to fill the through-holes to form the first contact plugs 60.

A first level interconnect layer 91 is then deposited on the first interlayer dielectric film 48 and patterned to form the first level interconnects 91a to 91e. The second interlayer dielectric film 92 is then deposited on the first level interconnects 91a to 91e and the first interlayer dielectric film 48, and subjected to planarization and patterning thereof to form through-holes therein. The second contact plugs 96 are then formed similarly to the first contact plugs 60. Further, a bottom electrode layer 97, a ferroelectric film 98 and a top electrode layer 99 are consecutively deposited on the third interlayer dielectric film 94, followed by formation of a photoresist mask 108.

Thereafter, the bottom electrode layer 97, the ferroelectric film 98 and the top electrode layer 99 are subjected to patterning to form the ferroelectric capacitor 100, followed by deposition of a 100-nm-thick $O_3$-TEOS BPSG film or plasma TEOS BPSG film to form the bottom third interlayer dielectric film 95A.

Subsequently, the hydrogen barrier layer 106 is deposited on the bottom third interlayer dielectric film 95 and a photoresist mask 110 is formed thereon.

The hydrogen barrier layer 106 is then subjected to etching using a RIE technique to leave the hydrogen barrier layer 106 covering the entire area of the FeRAM macro block 41.

An $O_3$-TEOS BPSG film or plasma TEOS BPSG film having a thickness of 100 to 300 nm thick is then deposited as the top third interlayer dielectric film 95B, followed by etching thereof to form openings therein for exposing the top electrode 99 and the second level interconnect 93b. The plate interconnect 104 is then formed by deposition and patterning.

Figure 9:
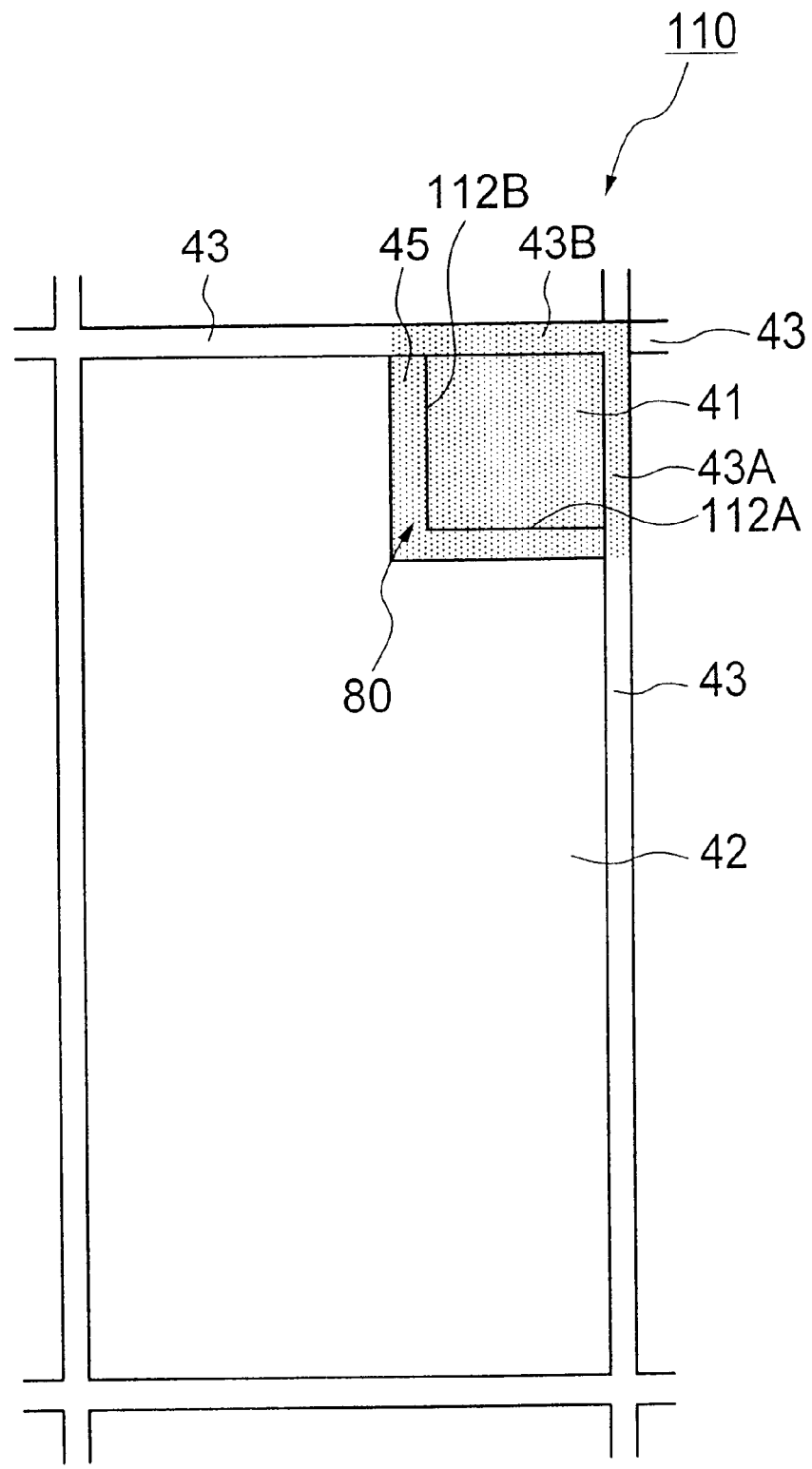
FIG. 9 is a schematic top plan view of an embedded LSI according to a third embodiment of the present invention.

Referring to FIG. 9, an embedded LSI 110 according to a third embodiment of the present invention includes a FeRAM macro block 41 at a corner region of the chip where two elongate scribing areas 43 intersect one another. The peripheral circuit 45 of the FeRAM macro block 41 is disposed at the boundary between the logic circuit section 42 and the FeRAM macro block., and not disposed in the periphery of the chip.

In the embedded LSI of FIG. 9, the hydrogen barrier layer 80 shown by hatching covers the FeRAM cell array 41, the peripheral circuit 45 and portions 43A and 43B of the scribing area 43 adjacent to the FeRAM macro block 41. The hydrogen barrier layer 80 covering the portions 43A and 43B of the scribing area 43 effectively prevents hydrogen from entering the FeRAM macro block 41 during the hydrogen-annealing process. The peripheral circuit 45 disposed at the boundary between the FeRAM macro block 41 and the logic circuit section 42 also effectively prevents the hydrogen from entering the FeRAM macro block 41, similarly to the first and second embodiments.

Figure 10:
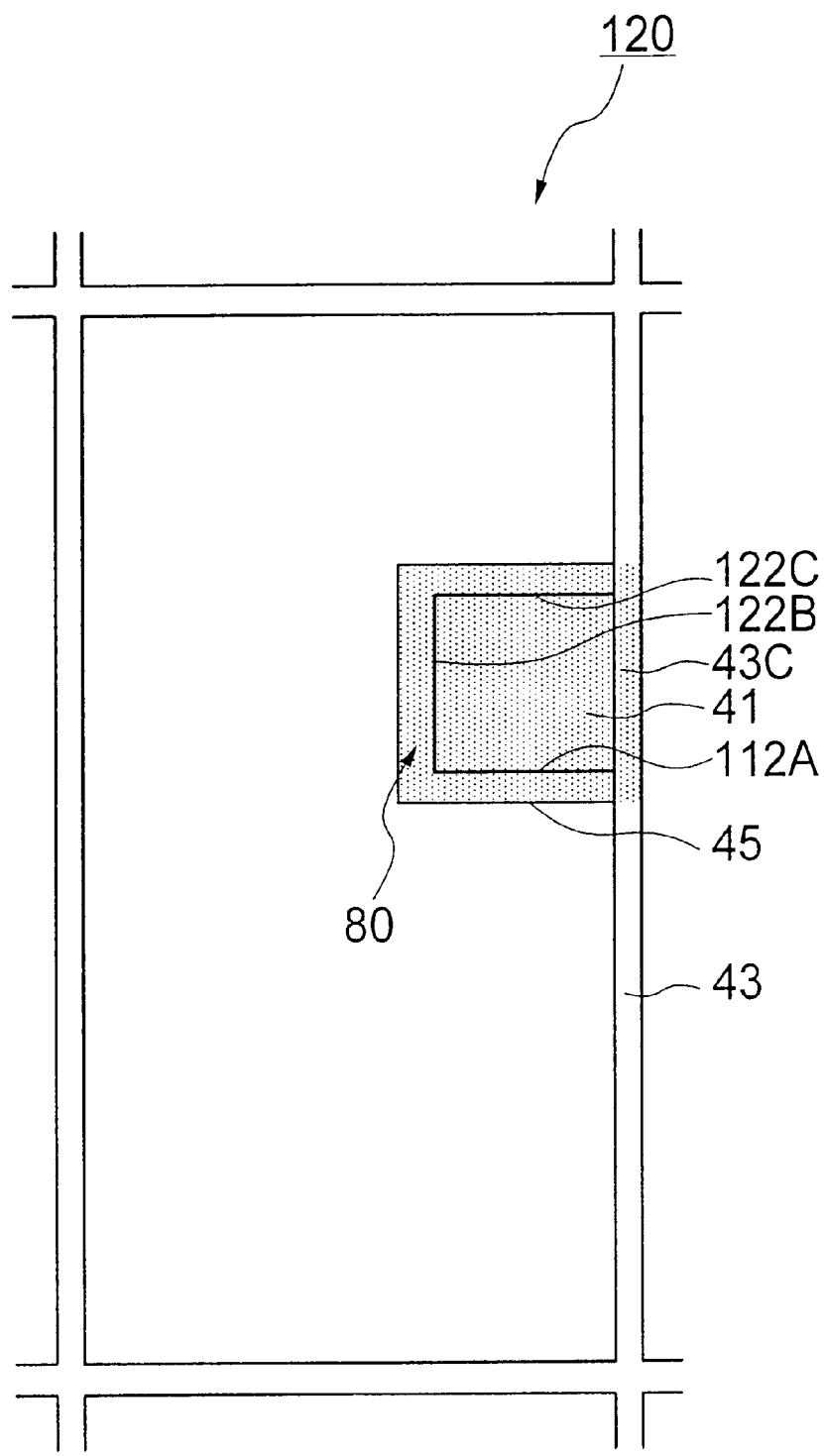
FIG. 10 is a schematic top plan view of an embedded LSI according to a fourth embodiment of the present invention.

Referring to FIG. 10, an embedded LSI 120 according to a fourth embodiment of the present invention has a FeRAM macro block 41 in the vicinity of a scribing area 43 of a wafer. The peripheral circuit 45 of the FeRAM macro block 41 is disposed at three sides 122A, 122B and 122C of the FeRAM macro block 41 constituting the boundary between the FeRAM macro block 41 and the logic circuit section 42. The hydrogen barrier layer 80 shown by hatching covers the FeRAM cell array 41, the peripheral circuit 45 and a portion 43C of the scribing area 43 adjacent to the FeRAM macro block 41.

The hydrogen barrier layer 80 covering the portion 43C of the scribing area 43 and the peripheral circuit 45 effectively prevents the ingress of hydrogen.

In the first and second embodiments, the hydrogen barrier layers 80 and 106 are implemented by 100-nm-thick plasma CVD $Si_3N_4$. The plasma CVD $Si_3N_4$ may be replaced by other films, the configurations of which are tabulated in following Table 1.

TABLE 1

| Material for hydrogen barrier layer | Thickness (nm) | | Deposition technique | Temp. ° C. |
| --- | --- | --- | --- | --- |
| | Preferred range | More preferred range | | |
| Si₃N₄ | 10–300 | 50–200 | Plasma-enh. CVD | 300–400 |
| SiON | 10–300 | 50–200 | Plasma-enh. CVD | 300–400 |
| Al | 50–100 | 100–2000 | Sputtering | Room temperature.-400 |
| AlN | 50–100 | 100–2000 | Sputtering | Room temperature.-400 |
| Pt | 50–100 | 100–2000 | Sputtering | Room temperature.-400 |
| Ti | 50–100 | 100–2000 | Sputtering or CVD | Room temperature.-400 |
| TiN | 50–100 | 100–2000 | Sputtering or CVD | Room temperature.-400 |
| TiON | 50–100 | 100–2000 | Sputtering or CVD | Room temperature.-400 |
| TiO₂ | 50–100 | 100–2000 | Sputtering or CVD | Room temperature.-400 |

In addition, in the first and second embodiments, the ferroelectric film of the capacitor is implemented by PZT having a specific configuration. However, other materials or configurations may be used instead, which are tabulated in following Table 2.

TABLE 2

| Material for ferroelectric film | Thickness (nm) | | Deposition technique | Temp. ° C. For deposition (or sintering) |
| --- | --- | --- | --- | --- |
| | Preferred range | More preferred range | | |
| PZT or (PLZT) | 50–500 | 100–300 | Sputtering Sol-gel CVD | (600) (600) 350–450 |
| SBT | 50–500 | 100–300 | Sputtering Sol-gel | (800) (800) |

In the first and second embodiments, the bottom electrodes 68 and 97 are implemented by a 20-nm-thick bottom Ti film and a 150-nm-thick top Pt film. However, other materials and configurations may be used for the bottom electrode, which are tabulated in following Table 3.

TABLE 3

| Material for bottom electrode | Thickness (nm) | | Deposition technique |
| --- | --- | --- | --- |
| | Preferred range | More preferred range | |
| Pt (top) | 50–300 | 100–200 | Sputtering |
| Ti bottom | 5–100 | 10–50 | Sputtering |
| Ir (top) | 50–300 | 100–200 | Sputtering |
| IrO₂ bottom | 10–200 | 30–100 | Sputtering |

In the first and second embodiments, the top electrodes 64 and 99 are implemented by a 50-nm-thick bottom Ir film and a 100-nm-thick top IrO2 film. However, other materials and configurations may be used for the top electrode, and are tabulated in following Table 4.

TABLE 4

| Material for top electrode | Thickness (nm) | | Deposition technique |
| --- | --- | --- | --- |
| | Preferred range | More preferred range | |
| Pt (top) | 50–300 | 100–200 | Sputtering |
| Ti bottom | 5–100 | 10–50 | Sputtering |
| Ir (top) | 30–300 | 50–200 | Sputtering |
| IrO₂ bottom | 50–300 | 100–200 | Sputtering |

Samples for the first embodiment of the present invention were fabricated, and subjected to measurements of the threshold voltage of the MOSFET 78 in the logic circuit section 42 after a hydrogen-annealing process conducted thereto. The results of the measurements ranged 0.633±0.003 volts with lower dispersions. Without the hydrogen-annealing process for the logic circuit section 42, the threshold voltage of MOSFET 78 ranged 0.768±0.025 volts with higher dispersions.

Figure 11A:
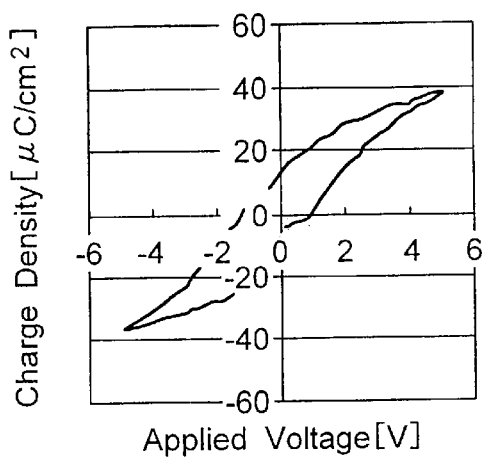
FIGS. 11A to 11C are graphs for showing the relationships between the charge density of a ferroelectric capacitor and the applied voltage.
Figure 11B:
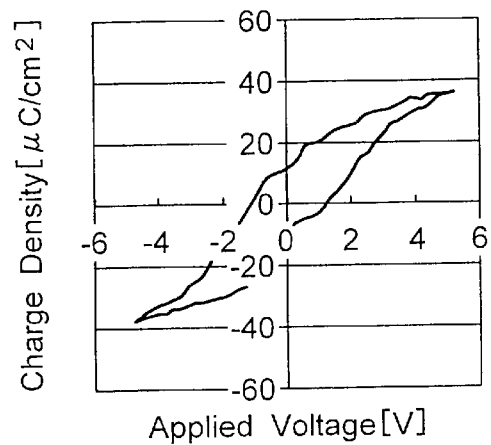

Further, the relationship between the charge density and the applied voltage of the ferroelectric capacitor in the FeRAM cell array was measured for examining the ferroelectric property thereof. The results of the measurements are shown in FIG. 11A. The measurements were also conducted to a comparative example, which had configurations similar to those of the sample and was not subjected to the hydrogen-annealing process, and the results of the measurements are shown in FIG. 11B. Further, another comparative example was fabricated which had configurations similar to the sample except for the absence of the hydrogen barrier layer in the another comparative example and subjected to measurements after the hydrogen-annealing process.

Figure 11C:
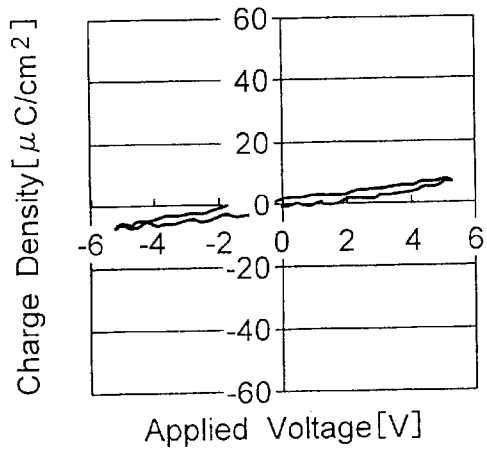

As understood from FIGS. 11A and 11B showing similar effective hysteresis curves, the hydrogen barrier layer provided in the sample had an effective hydrogen barrier property. As understood from FIG. 11C, without the hydrogen barrier layer covering the FeRAM macro block, the ferroelectric property of the ferroelectric capacitor is degraded by the hydrogen generated in the hydrogen-annealing process conducted for the logic circuit section.

Since the above embodiments are described only for examples, the present invention is not limited to the above embodiments and various modifications or alterations can be easily made therefrom by those skilled in the art without departing from the scope of the present invention.

What is claimed is:

1. An embedded LSI comprising a substrate, an FeRAM section and a logic circuit section formed on said substrate for operating in association with each other, said FeRAM section including an array of FeRAM cells each including a ferroelectric capacitor formed over a first interconnect layer and a second metal interconnect layer and an associated peripheral circuit, a boundary area for separating said FeRAM section from said logic circuit section, a hydrogen barrier layer for covering substantially an entire area of said FeRAM section, and exposing said logic circuit section, and said hydrogen barrier layer having an edge substantially aligned with said boundary area.

2. The embedded LSI as defined in claim 1, wherein said FeRAM section has a corner substantially aligned with a corner of said embedded LSI, and said peripheral circuit is not disposed adjacent to said corner of said FeRAM section.

3. The embedded LSI as defined in claim 1, wherein said FeRAM section has a side substantially aligned with a side of said embedded LSI, and said peripheral circuit is not disposed adjacent to said side of said FeRAM section.

4. The embedded LSI as defined in claim 1, wherein said hydrogen barrier layer includes $Si_3N_4$, SiON, Al, AlN, Pt, Ti, TiN, TiON and/or $TiO_2$.

5. The embedded LSI as defined in claim 1, wherein said ferroelectric film includes PZT or SBT.

6. An embedded LSI comprising a substrate, an FeRAM section and a logic circuit section formed on said substrate for operating in association with each other, said FeRAM section including an array of FeRAM cells each including a ferroelectric capacitor formed under a first interconnection layer and a second metal interconnect layer and an associated peripheral circuit, a boundary area for separating said FeRAM section from said logic circuit section, a hydrogen barrier layer for covering substantially an entire area of said FeRAM section and exposing said logic circuit section, and said hydrogen barrier layer having an edge substantially aligned with said boundary area.

7. The embedded LSI as defined in claim 6, wherein said FeRAM section has a corner substantially aligned with a corner of said embedded LSI, and said peripheral circuit is not disposed adjacent to said corner of said FeRAM section.

8. The embedded LSI as defined in claim 6, wherein said FeRAM section has a side substantially aligned with a side of said embedded LSI, and said peripheral circuit is not disposed adjacent to said side of said FeRAM section.

9. The embedded LSI as defined in claim 6, wherein said hydrogen barrier layer includes $Si_3N_4$, SiON, Al, AlN, Pt, Ti, TiN, TiON and/or $TiO_2$.

10. The embedded LSI as defined in claim 6, wherein said ferroelectric film includes PZT or SBT.

* * * * *